United States Patent
Smith, III et al.

[19]

[11] Patent Number: 6,023,577
[45] Date of Patent: Feb. 8, 2000

[54] METHOD FOR USE IN SIMULATION OF AN SOI DEVICE

[75] Inventors: George E. Smith, III, Wappingers Falls; Lawrence F. Wagner, Jr., Fishkill; Timothy L. Walters, Poughkeepsie; Fariborz Assaderaghi, Mahopac, all of N.Y.

[73] Assignee: International Business Machines Corporation, Armonk, N.Y.

[21] Appl. No.: 08/938,676

[22] Filed: Sep. 26, 1997

[51] Int. Cl.⁷ ..................................................... G06G 7/48
[52] U.S. Cl. ............................... 395/500.35; 395/500.25; 395/500.41
[58] Field of Search ................................. 364/488, 578, 364/489, 490, 491; 395/500.23, 500.25, 500.34, 500.35, 500.41

[56] References Cited

U.S. PATENT DOCUMENTS

| | | | |
|---|---|---|---|
| 5,384,720 | 1/1995 | Ku et al. | 364/578 |
| 5,396,615 | 3/1995 | Tani | 395/500 |
| 5,424,964 | 6/1995 | Machala, III et al. | 364/578 |
| 5,446,676 | 8/1995 | Huang et al. | 364/578 |
| 5,553,008 | 9/1996 | Huang et al. | 364/578 |
| 5,600,578 | 2/1997 | Fang et al. | 364/578 |
| 5,606,518 | 2/1997 | Fang et al. | 364/578 |
| 5,617,325 | 4/1997 | Schaefer | 364/488 |
| 5,774,367 | 6/1998 | Reyes et al. | 364/488 |
| 5,796,624 | 8/1998 | Sridhar et al. | 364/489 |

OTHER PUBLICATIONS

Matloubian et al., "Modeling of the subthreshold characteristics of SOI MOSFETs with floating body," IEEE Transaction on Electron Devices, vol. 37, Issue 9, ISSN 0018–9383, Sep., 1990.

Krishman et al., "BiMOS modeling for reliable SOI circuit design," SOI Conference 1996 Proceedings, IEEE International, Sep. 1996.

*Primary Examiner*—Frank J. Asta
*Assistant Examiner*—Daniel Patru
*Attorney, Agent, or Firm*—Lynn L. Augspurger

[57] ABSTRACT

A method for use in electronic design models encoded into design software for use in SOI based FET logic design includes simulation of an SOI device and setting a floating body voltage to any desired value at any time during the simulation, by adding to the model an ideal voltage source, whose value is a desired body voltage, in series with an ideal current source, whose value is a constant times the voltage across itself. When the constant is zero no current can flow, and any additional components have no effect on the circuit. When the constant is non-zero, said ideal current source appears to be the same as a resistor such that, current can flow in to or out from the body node, setting its voltage. The constant is kept zero at all times, except when it is desired to change the body voltage. The body voltage can be reset at any time to solve the problem of successive delays in one simulation run and resetting the voltage before each delay measurement starts. To solve the problem of predicting the delay in a delay predictor (for example, NDR rules generation), the offset from the body voltage as a part of the best case/worst case determination is included.

10 Claims, 1 Drawing Sheet

INPN  PARASITIC LATERAL NPN TRANSISTOR COLLECTOR CURRRENT
IBS, IBD  INTERNAL BASE–EMITTER AND BASE–COLLECTOR DIODES FOR NPN
ISB, IDB  IMPACT IONIZATION CURRENT WHICH CHARGES FLOATING BODY
CSB, CDB  THESE CAPACITORS INCLUDE EXTRA DIFFUSION CAPACITANCE
CSX, CBX, CDX  CAPACITANCE TO BACK OXIDE
B  INTERNAL FLOATING BODY NODE

INPN PARASITIC LATERAL NPN TRANSISTOR COLLECTOR CURRRENT
IBS, IBD INTERNAL BASE-EMITTER AND BASE-COLLECTOR DIODES FOR NPN
ISB, IDB IMPACT IONIZATION CURRENT WHICH CHARGES FLOATING BODY
CSB, CDB THESE CAPACITORS INCLUDE EXTRA DIFFUSION CAPACITANCE
CSX, CBX, CDX CAPACITANCE TO BACK OXIDE
B INTERNAL FLOATING BODY NODE

METHOD FOR USE IN SIMULATION OF AN SOI DEVICE

FIELD OF THE INVENTION

This invention is related to silicon on insulator integrated circuits, and particularly to a method for accounting for SOI FET floating body voltages in delay calculations used in the creation of the circuit design.

BACKGROUND OF THE INVENTION

As background for our invention, simulations are used in the creation of silicon devices, including thin film devices made by a process known as silicon-on-insulator (also called SOI) to make SOI devices. SOI device performance depends on the current voltage on the floating body of the device. This body voltage depends, in turn, on the switching history of the device. Simulations used in the creation of silicon devices include conventional delay measurement processes, but there are no known simulation techniques which have a way to account for the effect of current body voltage. Prior methods of accounting for the history effect of the current body voltage required either simulating the exact history in question, or trying to bound the problem. Neither method is applicable to delay rules. Neither method allows correction for ordering of simulations within one run. Theoretically, accounting for the effect of current body voltage would be possible by simulating the entire switching history, but this is not practical and so conventional delay estimation processes do not have a way to account for this effect at all. Furthermore, as the usual procedure is to measure delays for several different loads in one simulation run, the use of a simulation history would not be acceptable. This dependence on the history of the simulation will give different, unpredictable results depending on the order of the simulation runs.

We have concluded that there is needed a way to simulate the effect in a way that can be used in a system used for simulating electrical delay such as those illustrated by Mitsubishi Denki K. K.'s U.S. Pat. No. 5,396,615 and Hitachi Micro Systems Inc.'s U.S. Pat. No. 5,384,720 as general examples of electrical simulation and design systems and yet to date this has not been achieved by others.

We would note that there are numerous publications and patents, which could be used to illustrate what others do with SOI devices, and what simulation techniques have been used. Among those are those referenced in this patent disclosure.

We also wish to acknowledge that in an unpublished report at International Business Machines Corporation in January, 1993 Messrs. Dubois,(E.); Shahidi,(G. G.) and Sun,(J. Y. C.) printed their "Analysis of the Speed Performance of Thin Film CMOS/SOI Ring Oscillators" in which they noted, after analyzing the performance advantage of thin-film SOI/CMOS ring oscillators over their bulk silicon counterparts using compact analytic modeling for circuit simulation, that most of the speed improvement of SOI over bulk at the time could be explained in terms of threshold voltage, body doping factor and junction capacitances. Their tabulated model based on DC current measurements of individual devices was also utilized to achieve higher accuracy. A residual discrepancy between simulated and measured propagation delays was found in both approaches. A comparison of the integrated currents and stored charges in the ring oscillators identified the source of this discrepancy in the underestimation of the charging/discharging currents. These researchers determined that transient enhancement of the current was not the source of this discrepancy by an analysis of the supply voltage dependence of the propagation delay. The sensitivity of the DC current characteristics of SOI devices to the ground rules was discussed and found by them to explain systematically poor predictions of the delay per stage by means of circuit simulation. This report was internal to IBM but it shows no way to simulate the effect of current body voltage in SOI device design, and illustrates the dismay of researches as to the poor prediction of delay by circuit simulation in this area.

We have concluded that there is needed a way to simulate the effect of current body voltage in SOI circuit device design is needed but yet to date this has not been achieved by others.

SUMMARY OF THE INVENTION

As will be described, we have developed a method to set the floating body voltage to any desired value for use at any time in and during a simulation.

The improvements which result from use of the method allows a designer to easily build delay rules that work with their current design methodology. The designer can have multiple delay simulations within one run, and get the same answer regardless of ordering. As a result of our method there are now known limits on the performance, and designers don't have to keep trying different combinations of inputs and history to find a best or worst case value.

These and other improvements are set forth in the following detailed description. For a better understanding of the invention with advantages and features, refer to the drawing and the detailed description below.

DRAWING

FIG. 1 illustrates an what we mean by a floating body and the current body voltage is the current body voltage at point B which is the body.

In this drawing:

INPN identifies the parasitic lateral NPN transistor collector current;

IBS, IBD identifies the internal base-emitter and base-collector diodes for NPN respectively;

ISB, IDB identifies the impact ionization current which charges the floating body;

CSB, CDB identifies those capacitors which include extra diffusion capacitance;

CSX, CBX, and CDX identifies the capacitance to back oxide;

B identifies the internal floating body node; while
  1 identifies an ideal voltage source and
  2 identifies an ideal current source

DETAILED DESCRIPTION OF THE INVENTION

Figure 1:
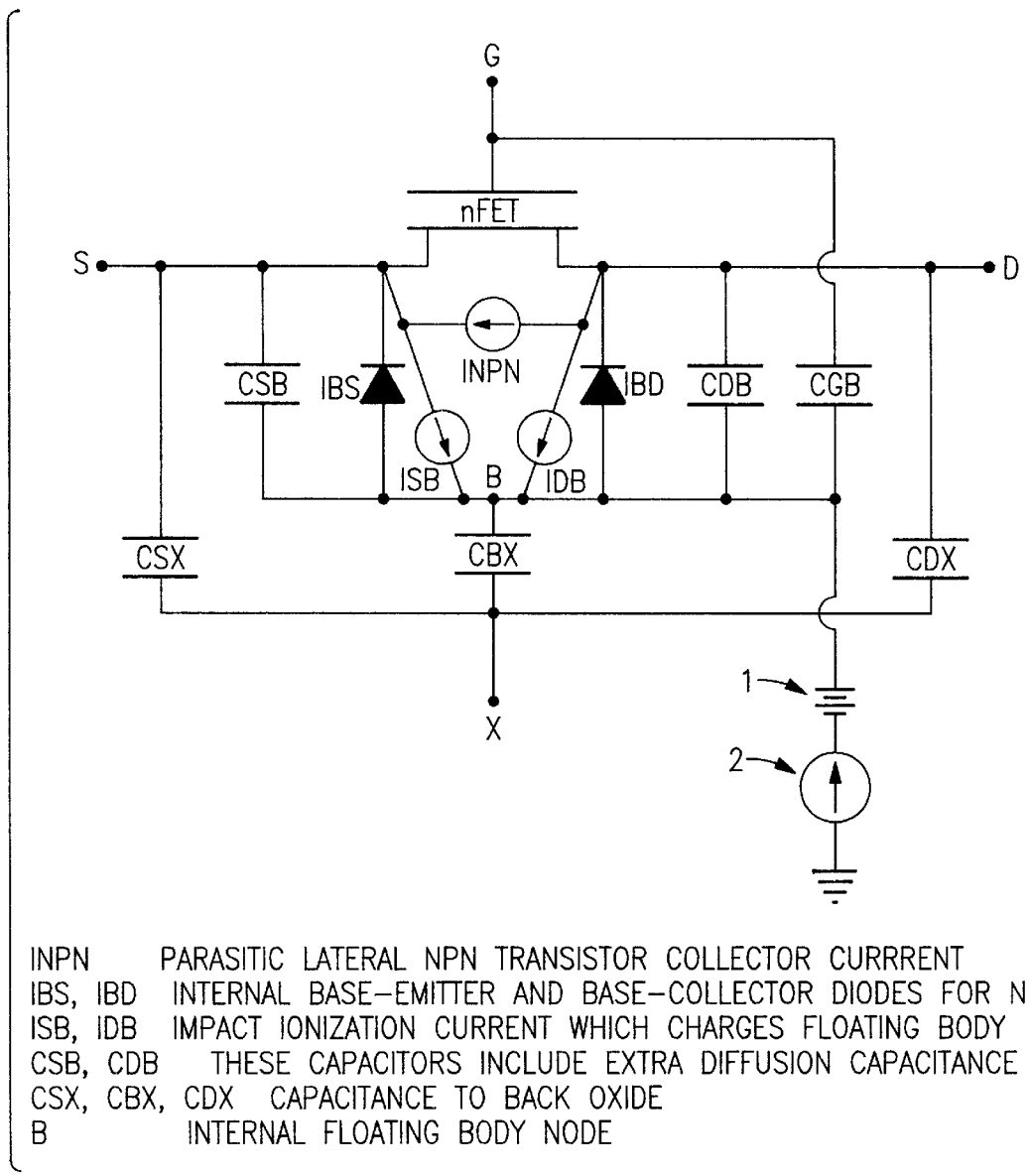

In accordance with our invention we have developed a method for use in a model for simulation of an SOI device comprising the steps of setting the floating body voltage to any desired value at any time during the simulation, by adding to the model an ideal voltage source, whose value is a desired body voltage, in series with an ideal current source, whose value is a constant (call it GJ) times the voltage across itself. As we have stated, FIG. 1 illustrates an what we mean by a floating body and the current body voltage is the current body voltage at point B which is the body. This FIGURE is applicable to either an NFET or PFET.

When the constant GJ is zero, no current can flow, and the additional components have no effect on the circuit. When the constant GJ is non-zero, the ideal current source appears to be the same as a resistor. Thus current can flow in to or out from the body node, setting its voltage.

The constant GJ is kept zero at all times, except when it is desired to change the body voltage.

Two steps are involved in selecting a value for the ideal voltage source, which will set the desired floating body voltage. First, a static body voltage can be computed solely by considering the terminal voltages of the device and the temperature. This voltage is the voltage the body will naturally settle at after a long time with no switching activity.

From that base static voltage, limits on the changes to this voltage can be found based on the different types of switching activity possible. For example, increasing the gate voltage of the device while holding the drain and source voltage constant will have a given effect on the body voltage.

Considering all of the switching types possible will give a range of possible voltage changes around the static body voltage. Depending on the type of simulation desired, we can then either pick one of these voltages at random to vary the static voltage with, to represent a device with an unknown switching history, or we can pick a value corresponding to a known switching history, or we can select the value giving the best or worst case delay.

As we can reset the body voltage at any time we desire, we can solve the problem of successive delays in one simulation run by resetting the voltage before each delay measurement starts.

To solve the problem of predicting the delay in a delay predictor (for example, NDR or delay rules generation), we can include the offset from the body voltage as a part of the best case/worst case determination. For example, to find the fastest delay of a circuit, in addition to selecting the fastest process and environment variables, select the body voltage that gives the fastest delay. This can be done automatically with a distribution in AS/X, for example.

This methodology has been implemented in IBM's AS/X system or other circuit simulators like SPICE for use in a model for SOI simulation, and can be used by any designer using SOI based FET logic. There methods can be encoded into standard electronic design software, and they typically will be described in their documentation.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A method for use in a model for simulation of an SOI device, comprising the steps of:

setting the floating body voltage to any desired value at any time during the simulation, by adding to the model an ideal voltage source, whose value is a desired body voltage, in series with an ideal current source, whose value is a constant times the voltage across itself.

2. A method for use in a model according to claim 1 wherein when the constant is zero, no current can flow, and any additional components have no effect on the circuit.

3. A method for use in a model according to claim 2 wherein when the constant is non-zero, said ideal current source appears to be the same as a resistor such that current can flow into or out from the body node, setting its voltage, and wherein said constant is kept at zero at all times, except which it is desired to change the body voltage.

4. A method for use in a model according to claim 3 wherein for use in selecting a value for the ideal voltage source which will set the desired floating body voltage, wherein a first, a static body voltage is computed solely by considering the terminal voltages of the device and the temperature and in which the said static body voltage is the voltage the body will naturally settle at after a long time with no switching activity.

5. A method for use in a model according to claim 4 wherein from said base static voltage, limits on the changes to this voltage are found based on the different types of switching activity possible.

6. A method for use in a model according to claim 5 wherein limits on the changes to said static body voltage are found by increasing the gate voltage of the device while holding the drain and source voltage constant will have a given effect on the body voltage.

7. A method for use in a model according to claim 5 wherein different switching types are considered and after considering all of the switching types a range of possible voltage changes around the static body voltage is provided.

8. A method for use in a model according to claim 4 including as step of providing an offset from the body voltage as a part of the best case/worst case determination.

9. A method for use in a model according to claim 4 including as step of resetting said body voltage at any time desired in a simulation by resetting the voltage before each delay measurement starts.

10. A method according to claim 1 wherein said method is encoded into design software for use in SOI based FET logic design.

* * * * *